United States Patent [19]

Curtin

[11] Patent Number: 6,160,215
[45] Date of Patent: Dec. 12, 2000

[54] METHOD OF MAKING PHOTOVOLTAIC DEVICE

[76] Inventor: Lawrence F. Curtin, 215 Cranwood Dr., Key Biscayne, Fla. 33149

[21] Appl. No.: 09/351,136

[22] Filed: Jul. 12, 1999

Related U.S. Application Data

[60] Provisional application No. 60/126,325, Mar. 26, 1999.

[51] Int. Cl.[7] .................................................. H01L 25/00
[52] U.S. Cl. ............................................ 136/244; 136/251
[58] Field of Search ..................................... 136/244, 251

[56] References Cited

U.S. PATENT DOCUMENTS

| | | | |
|---|---|---|---|
| 3,729,343 | 4/1973 | Thomas | 136/225 |
| 4,363,929 | 12/1982 | Bollen | 136/234 |
| 4,860,509 | 8/1989 | Laaly et al. | 52/173 R |
| 5,176,758 | 1/1993 | Nath et al. | 136/251 |
| 5,298,085 | 3/1994 | Harvey et al. | 136/244 |
| 5,417,770 | 5/1995 | Saitoh et al. | 136/258 |
| 5,457,057 | 10/1995 | Nath et al. | 437/2 |
| 5,508,205 | 4/1996 | Dominguez et al. | 437/2 |
| 5,520,763 | 5/1996 | Johnstone | 136/233 |
| 5,674,325 | 10/1997 | Albright et al. | 136/250 |
| 5,868,869 | 2/1999 | Albright et al. | 136/250 |
| 5,968,287 | 10/1999 | Nath | 136/251 |
| 6,015,951 | 1/2000 | Ikai et al. | 136/257 |

*Primary Examiner*—Mark Chapman
*Attorney, Agent, or Firm*—Richard C. Litman

[57] ABSTRACT

A thin film photovoltaic cell product made with a removable adhesive backing, whereby the product can be adhered like a bumper sticker to glass or to other suitable substrate at the site of installation. The process includes the binding together of a first layer of photovoltaic material deposited onto a thin permanent substrate, a second layer of conductive metal foil, and a third layer comprising a contact transfer release sheet. The release sheet takes the place of plastic casing and transfers adhesive material to the cells so that the end user can simply remove the temporary barrier from the release sheet, apply the product to glass to construct, for example, photovoltaic arrays. The invention reduces transportation costs by enabling sheets of photovoltaic cells to be shipped separately from glass. It also enables placement of the photovoltaic cells directly beneath glass, which has much better optical properties and life expectancy than plastic casing.

8 Claims, 6 Drawing Sheets

METHOD OF MAKING PHOTOVOLTAIC DEVICE

CROSS-REFERENCE TO RELATED APPLICATION

This application claims the benefit of U.S. Provisional Patent Application Ser. No. 60/126,325, filed Mar. 26, 1999.

BACKGROUND OF THE INVENTION

1. Field of the Invention

The present invention relates to a photovoltaic cell product and a method for its manufacture.

2. Description of Related Art

Photovoltaic devices or solar cells absorb sunlight and convert it directly into electrical energy. The basic scientific principles which underly the effect of converting light energy into internal voltages using photovoltaic cells are well understood.

Most types of photovoltaic cells have a photoactive area, i.e., an area that generates electricity in response to light and is composed of a semiconductor layer disposed between two electrode layers deposited on a flat, supporting substrate. The photoactive area is divided into a number of photovoltaic cells interconnected in series to boost the voltage output. The photovoltaic cells may then be encapsulated, e.g. with plastic, to protect the cells from the external environment during transportation and operation of the cells. A number of electrically interconnected photovoltaic cells may be supported on a common rigid medium, such as glass, to form a photovoltaic module.

The process of sequentially forming photovoltaic layers onto a supporting substrate is a common technique for making "thin film photovoltaic cells," also a well known product. Most thin film solar cells are deposited onto glass as part of the manufacturing process. However, the sequential deposition of layers on a rigid medium such as glass is expensive, cumbersome, not well suited to high speed operation, and often expensive to ship. Moreover, the plastic casing is expensive and it remains a failure point throughout the life of the photovoltaic cells due to the tendency of plastic to degrade in sunlight. Thus, there is a need for an improved process of making thin film cells which is more suitable for high volume production, increased life span, versatility of the product, and lower manufacturing and transport costs.

U.S. Pat. No. 5,674,325 issued to Albright et al. on Oct. 7, 1997 is an example of a method of manufacturing a thin film photovoltaic device. Albright et. al. describes a process involving a "surrogate substrate" that is separated from film layers so that the film layers may eventually be incorporated into a photovoltaic cell to be supported on a permanent substrate. The Albright device does not have a permanent substrate onto which the photovoltaic material is deposited, rather it has a surrogate substrate. More importantly, the Albright device does not contain or suggest the use of a contact transfer release sheet as a top layer, over the thin film cells, or elsewhere. The same holds true for U.S. Pat. No. 5,868,869 issued to Albright et al. on Feb. 9, 1999. Other methods and devices similar to, or analogous with, thin film cells and their manufacture include U.S. Pat. No. 5,520,763 issued to Johnstone on May 28, 1996, which describes a manufacturing process in the printing art that uses a foil strip and a release sheet fed through a roller. Johnstone does not suggest the present method of making a photovoltaic device. U.S. Pat. No. 5,417,770 issued to Saitoh et al. on May 23, 1995 is a forming method used in the manufacture of a photovoltaic device. Saitoh et al. do not suggest the present method of making a photovoltaic device. U.S. Pat. No. 3,729,343 issued to R. D. Thomas on Apr. 24, 1973 describes a method of rolling a thermocouple tape. R. D. Thomas does not suggest the present method of making a photovoltaic device.

None of the above inventions and patents, taken either singly or in combination, is seen to describe the instant invention as claimed.

SUMMARY OF THE INVENTION

The present invention is a photovoltaic device and method for its manufacture that facilitates packaging, transport and installation of solar arrays. According to this invention, a photovoltaic product is manufactured in several discreet layers. First, a layer of photovoltaic material is deposited onto a thin substrate such as aluminum to form thin film cells. Next, a layer or strip of conductive metal foil tape is adhered along each of two opposite edges of the thin film cells, one strip along a positively charged edge of the cells and one strip along the negatively charged edge, in order to allow current to be drawn from the cells. The metal foil extends slightly beyond the thin film cells to create a contact point for an electrical conduit. A contact transfer release sheet is then adhered to the sheet of thin film cells and conductive foil tape.

The end product of this manufacturing process—that is, a sheet of material that includes a layer of thin film cells, a layer of conductive metal strips, and a contact transfer release sheet—can be shipped directly to a site where photovoltaic arrays are being constructed. After the cells have been shipped to a site, the non-adhesive layer (barrier) of the release sheet is peeled off of the cells and the foil tape like the backing of a bumper sticker, and the adhesive-coated cells are immediately applied to glass. For example, the cells are pressed onto glass in constructing a solar cell array. The sun shines through the glass and hits the photovoltaic thin film cells to create electricity. After the thin film cell sheet product is pressed onto glass, a contact point is identified at each sheet edge, along the segment of metal foil that extends beyond the cells. From these contact points, electrical energy is drawn off of the sheet.

Accordingly, it is a principal object of the invention to facilitate compact packaging and transport of photovoltaic cells, particularly for large-scale projects as, for example, in the construction of solar arrays.

It is another object of the invention to reduce transportation costs by enabling a sheet of photovoltaic cells to be shipped separately from any glass, aluminum frame, or any other typically heavy medium, thus reducing the weight and therefore the cost of shipping.

Still another object of the invention is to provide a process and a product that eliminates the need to encase thin film photovoltaic cells in plastic, which is costly.

It is an object of the invention to provide improved elements and arrangements thereof in an apparatus for the purposes described which is inexpensive, dependable and fully effective in accomplishing its intended purposes.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
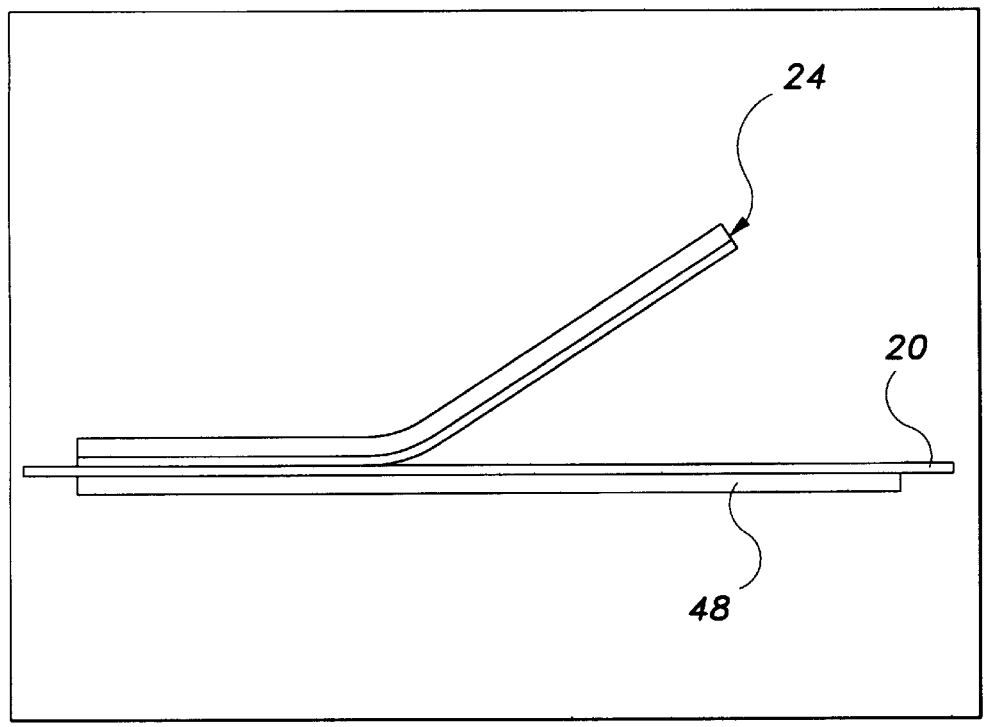
FIG. 1 is a symbolic representation of the manufacturing of photovoltaic cells involving adhering together thin film cells, metal conducting tape, and a contact transfer release sheet, respectively.
Figure 2:
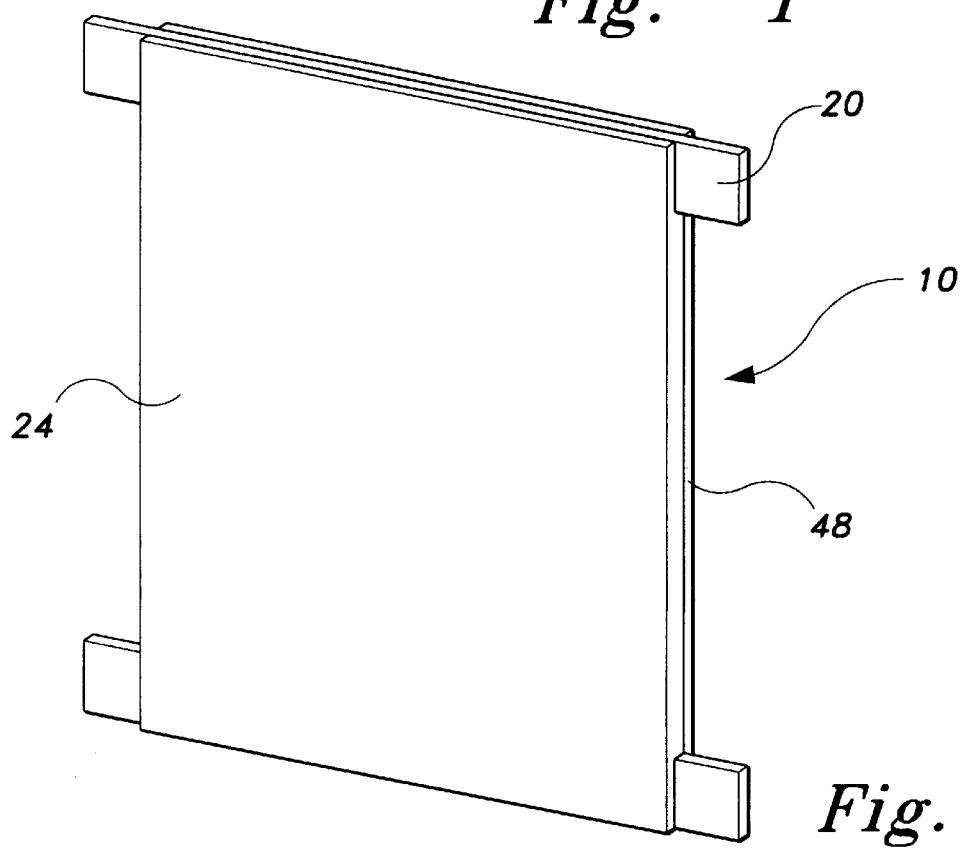
FIG. 2 is a perspective view of the sheet product resulting from the layering process disclosed in FIG. 1.
Figure 4:
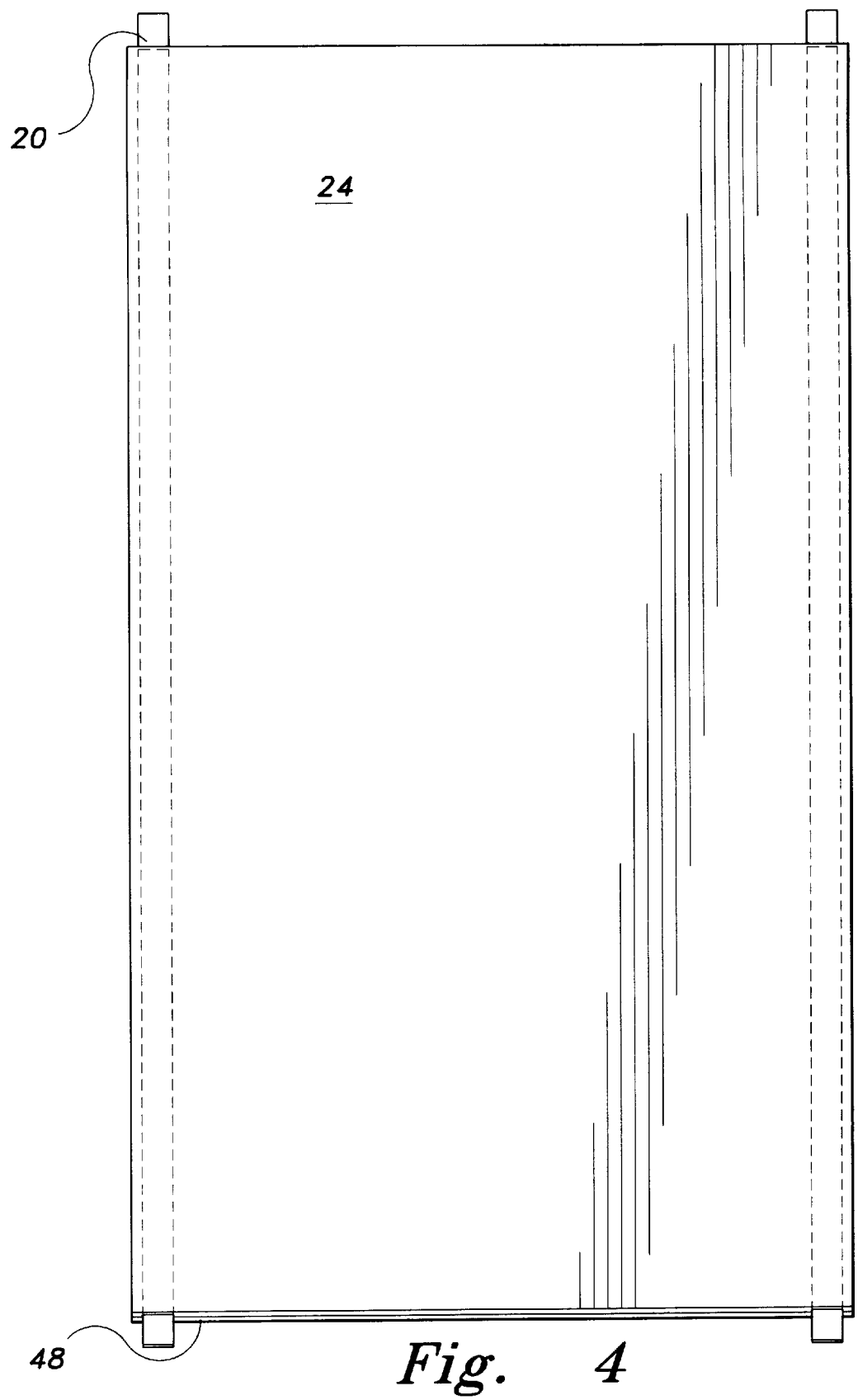
FIG. 4 is a plan view of a sheet of thin film cells on a permanent substrate with a layer of conductive metal foil, and a contact transfer release sheet.

FIG. 1 is a symbolic representation of the method used in making a thin film photovoltaic device. The method entails adhering together three well-known materials not previously found in combination into a single sheet. The product 10 resulting from the process of FIG. 1 is shown in FIGS. 2 and 4. Product 10 includes a first layer, base sheet 48, of thin film cells; a second layer comprising two parallel, electrically conductive foils 20; and a third layer comprising a contact transfer release sheet 24.

Figure 3:
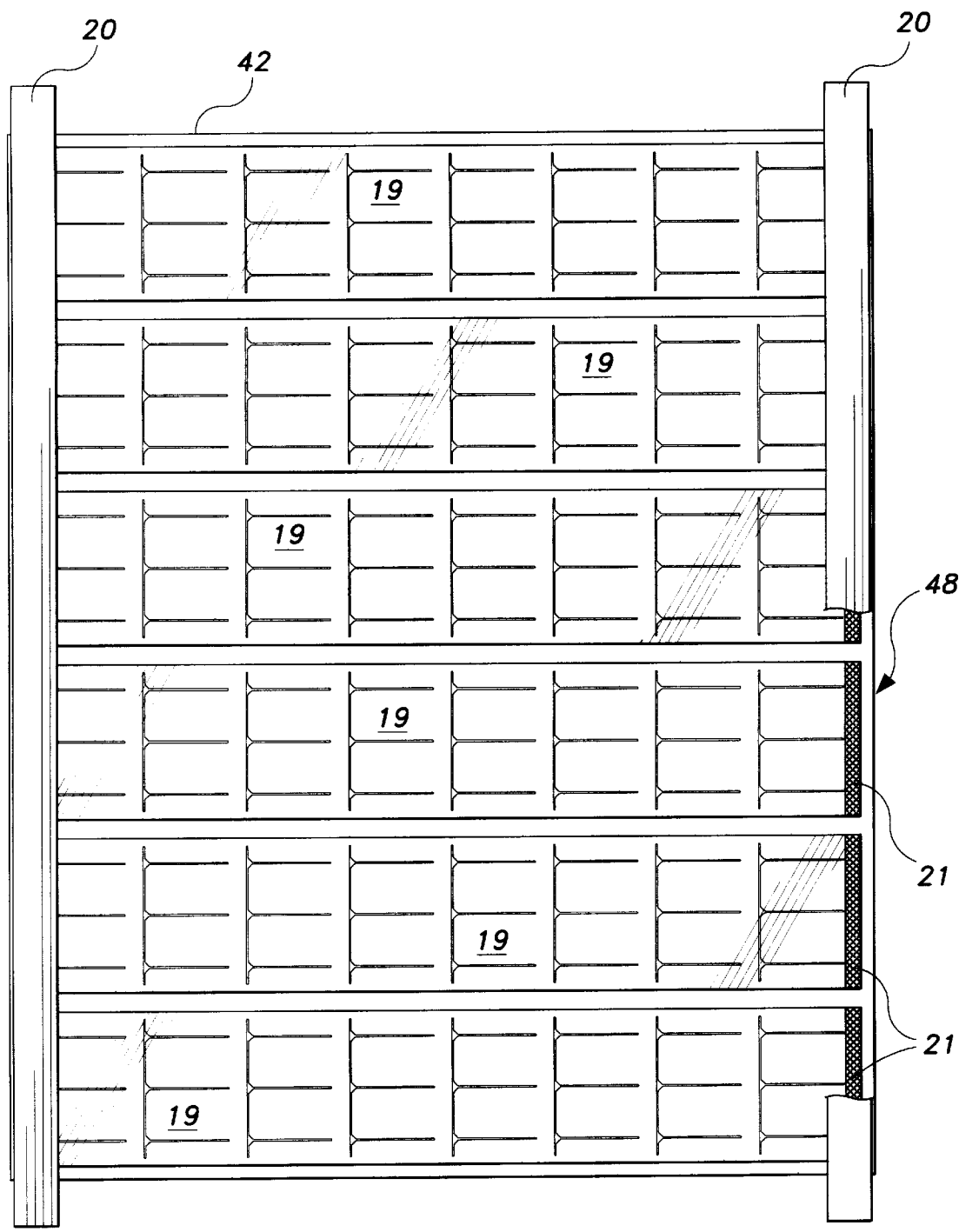
FIG. 3 is a plan view of a sheet of thin film cells on a permanent substrate with a layer of conductive metal foil, prior to placement of the contact transfer release sheet, corresponding to the first two specified layers of material (metal foil on thin film cells)

The first step of the process used to create product 10 involves depositing a thin film of photovoltaic material comprising a column of individual photovoltaic cells 19 onto a permanent substrate 16 to produce a sheet 48 of thin film cells 18. Substrate 16 is preferably a thin aluminum membrane, but may also be plastic, ceramic or any suitable substrate used in the manufacture of thin film photovoltaic cells. Sheet 48 is preferably 1 foot in width by 3 feet in length but may be modified in length depending upon the required wattage and customer needs. As shown in FIG. 3, the line 42 along which adjacent cells 19 are severed to form sheet 48 is mid-way between, and normal to, the longitudinal axis of, each of two pairs of adjacent bus bars 21, wherein the first pair of bars 21 is located on a side edge of said roll directly opposite a second pair. Each pair corresponds to two adjacent photovoltaic cells 19 on oppositely charged edges of sheet 48.

The second step involves adhering onto sheet 48 two parallel, electrically conductive foil strips 20 coated on their bottom side, i.e., the side facing sheet 48, with a bonding agent 23. One of foil strips 20 runs along the positive side of sheet 48, and one of foil strips 20 runs along the negative side of sheet 48. Each cell 19 has a bus bar 21 on the positive side of the cell and a bus bar 21 on the negative side of the cell to collect energy. Foil strips 20, superimposed over, and in electrical contact with, bus bars 21, continuously transmit that energy along sheet 48. Strips 20 extend approximately ⅜ of an inch beyond each opposite end designated by line 42 of sheet 48 so as to create a contact point 56 to which a wire 60 may be soldered for transmission of electrical energy across sheet 48. Foil strips 20 are preferably made of a malleable metal having electrically conductive properties suitable for collecting voltage along consecutive bus bars of photovoltaic cells. Such metals may include copper, tin coated copper, aluminum, or other suitable metals.

Figure 6:
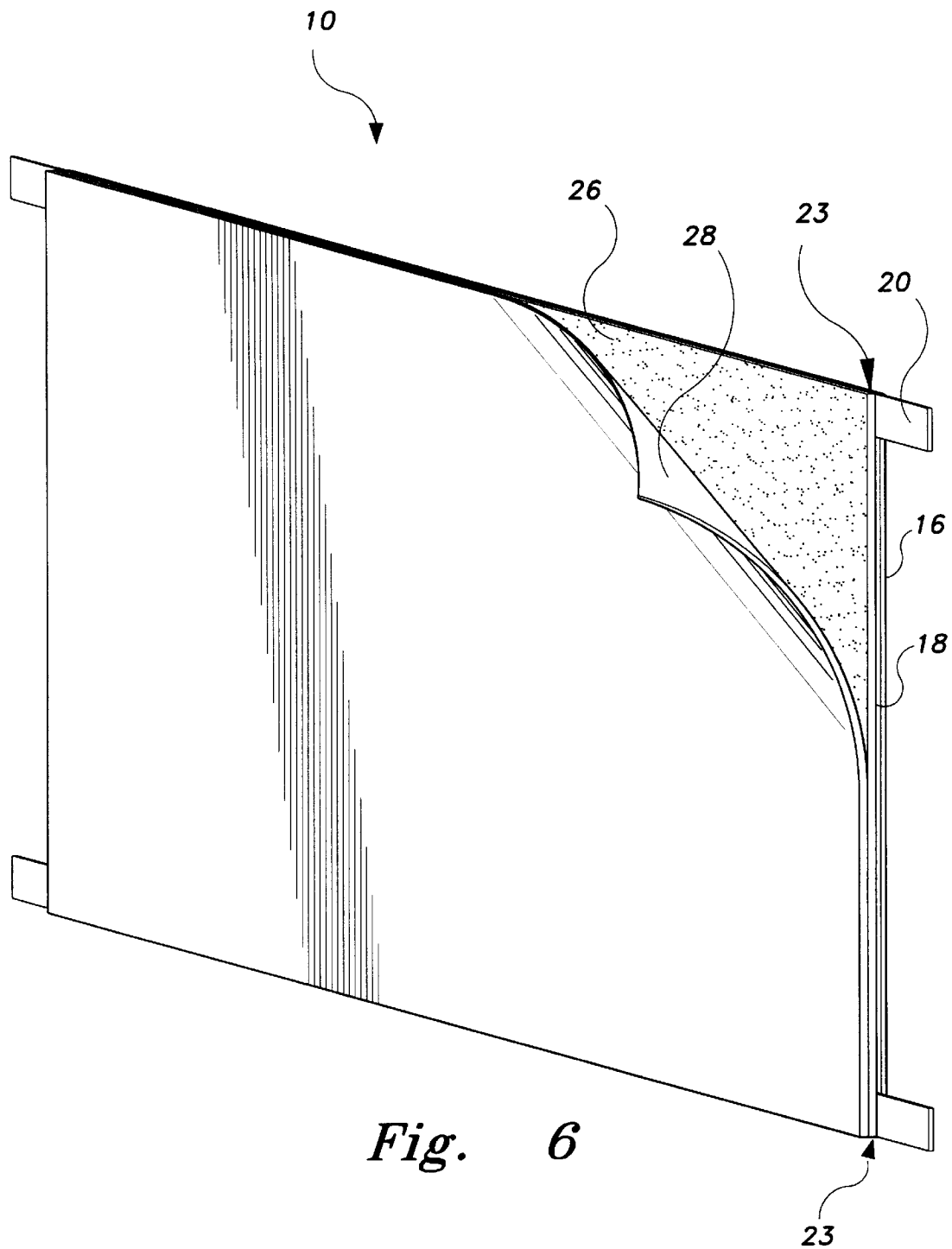
FIG. 6 shows the sheet product resulting from the process disclosed in FIG. 1, as the non-adhesive portion (barrier) of the contact transfer release sheet is removed.

The third step involves adhering a contact transfer release sheet 24 over foil strips 20 and sheet 48. Release sheet 24 generally takes the place of a plastic casing which, in the present invention, is not needed. The phrase "contact transfer release sheet" shall mean a thin sheet of material, typically a paper product or any other suitable adhesive-coated temporary barrier which "contacts," and "transfers" adhesive material to, a surface i.e., sheet 48 and strips 20), wherein the temporary barrier "releases" from the surface as it is peeled away, leaving only the adhesive on sheet 48 and strips 20. As shown in FIG. 6, contact transfer release sheet 24 preferably contains a clear, low-odor adhesive 26, a temporary barrier 28, and a release agent between adhesive 26 and barrier 28. The release agent may be any suitable releasing agent having such a thickness and/or optical properties that would not cause it to significantly interfere with the transmission of light or light energy. The adhesive on release sheet 24 is preferably silicone-based, although other clear adhesives may be used, but preferably clear adhesives allowing the broadest spectrum of light to pass therethrough. Barrier 28 may be a thin plastic or paper product as is typically used with bumper stickers or other such contact transfer release sheets.

Figure 5:
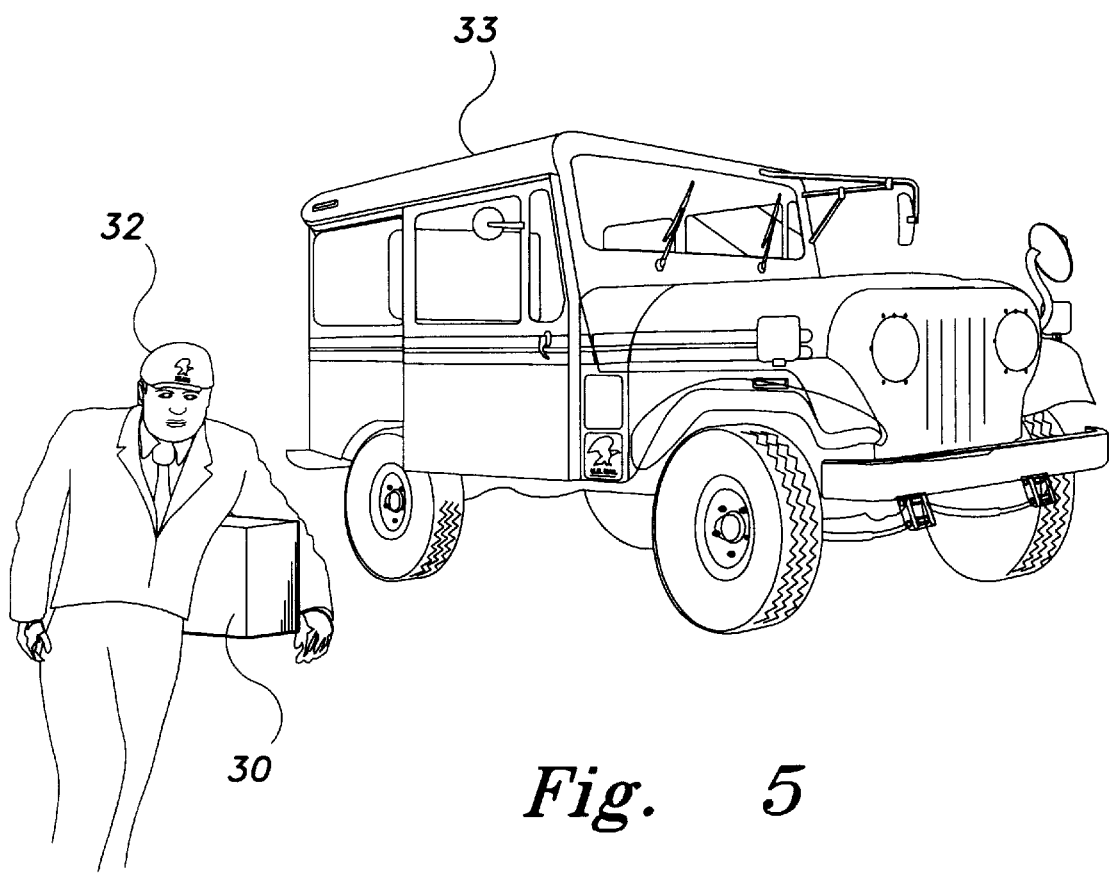
FIG. 5 shows a person carrying to a U.S.P.O. delivery truck a box of sheets of the photovoltaic cell product resulting from the process disclosed in FIG. 1.

In the manufacturing process, as release sheet 24 is applied, pressure between release sheet 24, foil 20, and sheet 48 transfers adhesive 26 of release sheet 24 onto foil strips 20 and onto sheet 48 to form product 10. Multiples of sheet 48 may be stacked in a box 30 for shipment. As shown in FIG. 5, box 30 may be conveniently carried by one person 32 and transported in any number of convenient ways including by Federal Express, U.P.S. or, as by a U.S. Postal truck 33.

Figure 7:
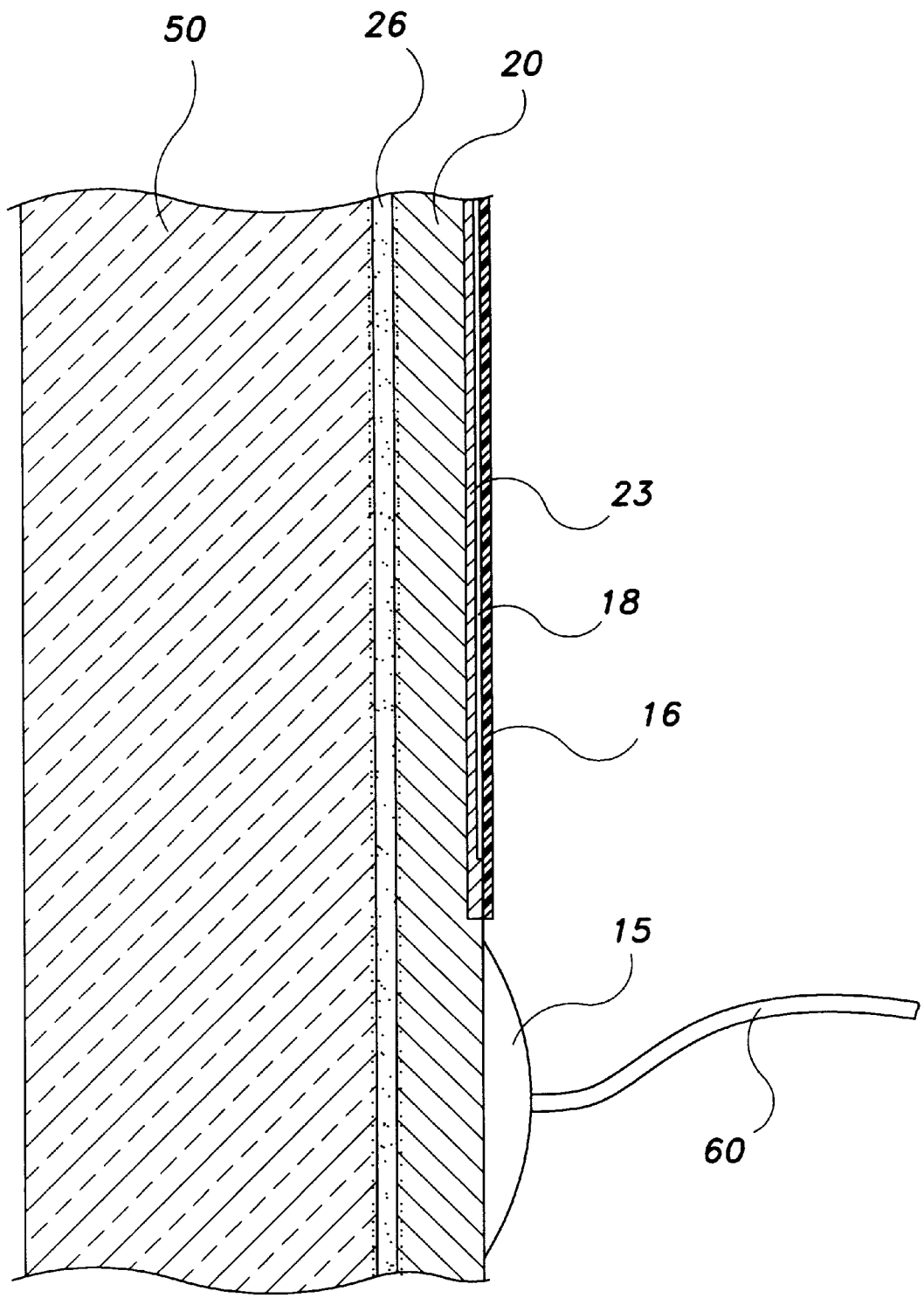
FIG. 7 shows adherence of the sheet product, with barrier removed, upon a rigid glass substrate. An electrical conduit is shown soldered to a contact point on the metal foil.

The preferred method of installing product 10, as shown in FIG. 6, comprises the steps of peeling barrier 28 from sheet 48 to reveal a surface coated by adhesive 26. Adhesive 26, remaining on the cells, reacts with air and begins to cure. The surface defined by adhesive 26 is then immediately pressed onto a rigid medium 50. Medium 50 will typically be a glass plate. FIG. 7 is a representation of product 10 as installed on medium 50.

Referring again to FIG. 7, after product 10 has been pressed onto medium 50, a conduit 60 is soldered to contact point 56, located on the back side of strips 20, opposite its point of contact with medium 50. Each sheet 48 of photovoltaic cells has at least one contact point on its left edge, and one contact point on its right edge, corresponding to positive and negative edges of sheet 48. From the contact points along the metal foil, energy is drawn off of sheet 48, from conduits soldered to contact points 56.

Most solar cells are laminated onto glass in manufacturing facilities. The present method of manufacture enables the photovoltaic cell to be shipped separately from a glass or aluminum frame, or other typically heavy substrate, thus reducing the weight and therefore the cost of shipping. Glass can be shipped at a cheaper rate separately, particularly in cases where the photovoltaic product is exported. This is because glass plants can be found at market locations virtually anywhere in the world.

Some other cells, in particular many kinds of thin film cells, are encased in plastic during the manufacturing process. The manufacturing process described by this invention eliminates the need to encase the cell in plastic, which is generally more costly compared to a contact adhesive release sheet. Furthermore, the use of the contact adhesive release sheet enables placement by the end-user of the photovoltaic cell directly beneath glass, which has much better optical properties and life span than the plastic encasing typically used. The sun's ultraviolet rays cause the elasticizers in the plastic or polyester encasing to migrate out, and to degrade the plastic, an effect which will destroy the cell over time.

It is to be understood that the present invention is not limited to the sole embodiments described above, but encompasses any and all embodiments within the scope of the following claims.

I claim:

1. A method of producing a thin film photovoltaic device, comprising the steps of:

depositing photovoltaic material onto a permanent substrate to form a sheet of thin film photovoltaic cells;

bonding two parallel, electrically conductive metal foil strips to side edges of the photovoltaic cells such that the strips extend slightly beyond an end of the photovoltaic cells to define electrical contact points;

providing a contact transfer release sheet having the same planar dimensions as the sheet of thin film photovoltaic cells;

adhering the contact transfer release sheet to the photovoltaic cells and to the foil strips.

2. A photovoltaic device, comprising:

a sheet of thin film cells comprising photovoltaic material deposited onto a substrate, said sheet having two side edges and two ends;

electrically conductive foil strips bonded along each of the ends and extending slightly beyond the side edges to form electrical contact points for electrical wires; and a contact transfer release sheet adhered to a surface of said thin film cells, the surface of said thin film cells having a layer of adhesive material, said release sheet having substantially the same planar dimensions as said sheet of thin film cells.

3. The product according to claim 2, wherein said substrate is aluminum.

4. The product according to claim 2, wherein said strips are two parallel metal strips.

5. The product according to claim 2, wherein said contact transfer release sheet contains a clear adhesive, a release agent, and a temporary barrier.

6. The product according to claim 5, wherein said adhesive is silicone-based.

7. The product according to claim 5, wherein said temporary barrier is a paper product or plastic.

8. A method of installing a sheet of thin film photovoltaic cells onto a transparent medium, the method comprising the steps of:

providing a photovoltaic device including a sheet of thin film photovoltaic cells deposited onto a substrate, the sheet having two side edges and two ends, a pair of electrically conductive foil strips, each bonded along each of the ends and extending slightly beyond the side edges to form electrical contact points, a layer of adhesive material on the photovoltaic cells, and a contact transfer release sheet adhered to the adhesive layer, wherein the release sheet has substantially the same planar dimensions as the sheet of thin film photovoltaic cells;

peeling the contact transfer release sheet from the layer of adhesive material to reveal an adhesive-coated sheet of thin film cells;

pressing the adhesive-coated sheet onto a substantially transparent, rigid medium;

soldering an electrical conduit to each of the electrical contact points such that each conduit extends away from the substantially transparent medium.

* * * * *